Figure 1:
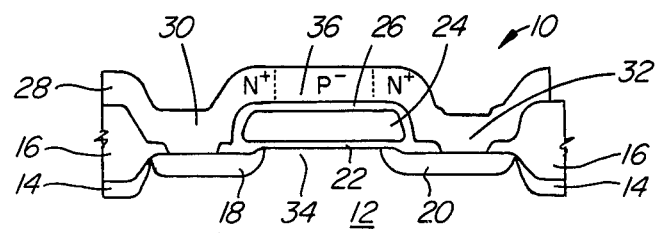

United States Patent [19]

Naem et al.

[11] Patent Number: 4,476,475

[45] Date of Patent: Oct. 9, 1984

[54] STACKED MOS TRANSISTOR

[75] Inventors: Abdalla A. Naem, Ottawa; Hussein M. Naguib, Kanata; Iain D. Calder; Albert R. Boothroyd, both of Nepean, all of Canada

[73] Assignee: Northern Telecom Limited, Montreal, Canada

[21] Appl. No.: 442,864

[22] Filed: Nov. 19, 1982

[51] Int. Cl.³ .................... H01L 29/78; H01L 27/02; H01L 29/04

[52] U.S. Cl. ................................ 357/23.7; 357/44; 357/42; 357/59

[58] Field of Search ................ 357/23 TF, 44, 42, 59

[56] References Cited

U.S. PATENT DOCUMENTS 4,272,880  6/1981  Pashley ................................ 357/42

4,309,224  1/1982  Shibata ................................ 357/59

OTHER PUBLICATIONS

Colinge et al. *Conf. IEDM* Wash D.C. USA Dec. 7-9, 1981, "ST-CMOS . . . Technology" pp. 557-560.

Primary Examiner—Martin H. Edlow
Assistant Examiner—Jerome Jackson
Attorney, Agent, or Firm—Stuart L. Wilkinson

[57] ABSTRACT

In a stacked metal-oxide-semiconductor (SMOS) transistor, the transistor source, drain and channel each have a lower part formed in a silicon substrate and an upper part composed of recrystallized polysilicon. The device gate is located between the upper and lower channel parts. By vertically integrating a MOS transistor, performance limitations imposed by the direct scaling approach to device miniaturization are avoided.

5 Claims, 12 Drawing Figures

STACKED MOS TRANSISTOR

This invention relates to metal-oxide-semiconductor (MOS) transistors and to a method for making them.

In the design of new very large scale integrated (VLSI) circuits, attempts have been made to reduce the device area by scaling the structural and electrical parameters in proportion. However, there are limitations imposed by this approach on device performance and technology, as described by Hoeneisen and Mead, in Solid State Electronics, Volume 15, pages 819–829, 1972.

Recently, vertical integration of devices has been proposed as an alternative to scaling down device area to achieve higher packing density. This technique has, for example, been applied to CMOS inverters. Stacked CMOS inverters having a common gate for both n- and p-channel transistors have been described by Gibbons et al, IEEE Electron Device Letters, EDL-1, page 117 et seq, and by Goeloe et al, IEDM, Washington, D.C., page 554 et seq, 1981. Also a CMOS inverter more conductive to standard silicon integrated circuit fabrication techniques has been suggested by Colinge et al, IEEE Electron Device Letters, EDL-2, page 250 et seq, 1981. The n- and p-type transistors making up the inverter are stacked one on top of the other and have a common gate and a common drain. The top part of the drain is laser annealed polysilicon which is essentially integral with a bottom part of the drain formed within the silicon substrate.

According to one aspect of the invention there is provided a metal-oxide-semiconductor structure having a gate, a source, a drain and a channel extending between the source and drain, the channel being separated from the gate by an insulating layer wherein each of the source, the drain and the channel have a lower part formed in a silicon substrate and an upper part composed of recrystallized polysilicon, the gate being located between the upper and lower channel parts.

In a preferred form of the device, the insulating layer is silicon dioxide and the gate consists of recrystallized polysilicon. In effect, the recrystallized polysilicon in which part of the source, the channel and the drain are located functions as a second silicon substrate which shares the device channel duty with the part of the channel formed within the silicon substrate.

To achieve further vertical integration appropriate oxide and polysilicon layers can be grown or deposited to form a transistor which has a common source and drain and several possible channel routes between them. Preferably the crystal orientation of the source, drain and channel regions formed within the recrystallised polysilicon is such as to form an essentially epitaxial continuation of the underlying source and drain regions within the substrate.

The Colinge et al stacked CMOS inverter mentioned previously comprises a pair of independent transistors which share a common drain and a common gate but have their sources isolated from one another. The stacked metal-oxide-semiconductor (SMOS) device now proposed is essentially a single transistor. By adopting a stacking technique, the device channel is vertically distributed so that the effective device area is halved. Device performance is improved when the channel regions are made narrow as well as short, as described by Naem in Electronic Letters, pages 135–136, February 1982.

According to another aspect of the invention there is provided in a method of fabricating a stacked metal-oxide-semiconductor structure the steps of forming a first source region and a first drain region in a silicon substrate, forming a recrystallized polysilicon gate within an oxide layer overlying a channel region extending between the source and drain regions, subsequently forming thereon a recrystallized polysilicon layer, and forming in the recrystallized polysilicon layer a second source region and a second drain region with the two source regions in contact and the two drain regions in contact.

Preferably the recrystallized polysilicon in the source and drain regions extends to bonding pads. This eliminates the need for source and drain contact windows which provides an additional degree of freedom to the device designer.

The method preferably includes the following additional steps. All polysilicon is deposited by low pressure chemical vapour deposition. The polysilicon gate is defined and then recrystallized by laser annealing. The laser annealing step can also function to drive dopant into the gate and the first source and drain regions. The gate oxide within which the gate is formed is thermally grown in a two-stage process as a first layer before gate formation and a second layer after it. The gate oxide is etched through to the first source and drain regions before deposition of the top polysilicon layer. The polysilicon layer is doped by ion implantation to provide an active top layer substrate and is recrystallized by laser annealing after deposition of an anti-reflective nitride coating on the polysilicon layer to cover the source, drain, the top channel region and interconnects to bonding pads. Because the region of the polysilicon layer overlying the gate is thermally insulated from the substrate by two oxide layers and the gate itself, it is rendered several degrees hotter than the polysilicon overlying the drain and source regions. Therefore, upon cooling, it solidifies after recrystallization of the polysilicon overlying the source and drain regions. Consequently, crystal growth occurs first from the drain and source regions in the substrate by seeding of the adjacent polysilicon and finally reaches the polysilicon over the gate. Subsequently, using standard etching and photolithographic techniques, the anti-reflective coating is removed and the second source and drain regions are formed, for example, by dopant pre-deposition and drive-in.

Figure 3:
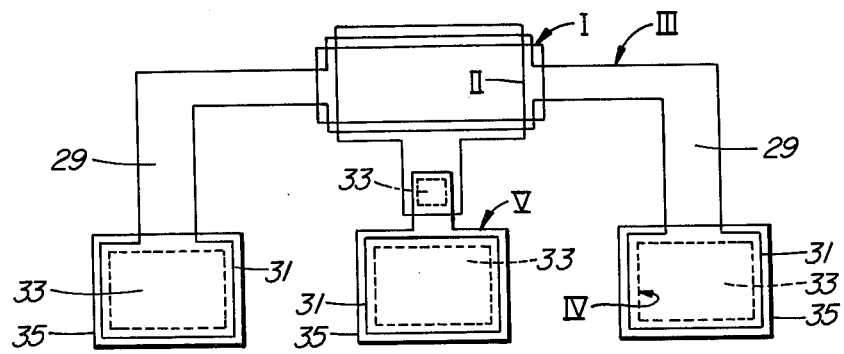
Figure 4A:
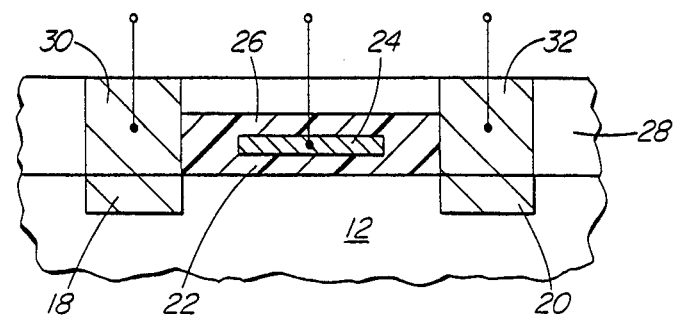
Figure 4B:
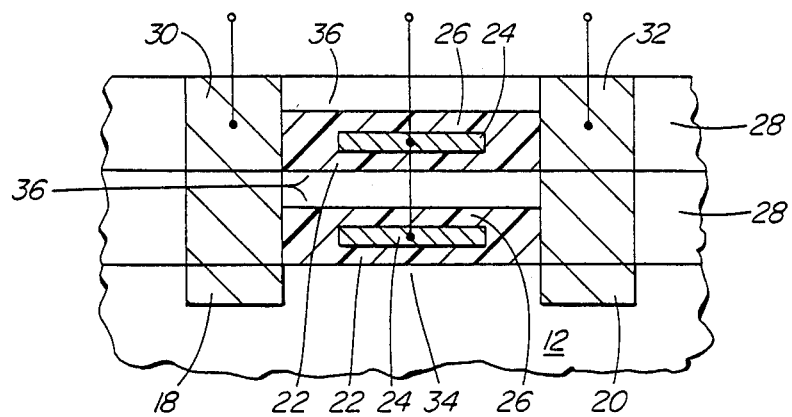

Embodiments of the invention will now be described by way of example with reference to the accompanying drawings in which:

FIG. 1 is a sectional view showing a SMOS transistor according to the invention;

FIGS. 2(a) to 2(h) show succesive stages in the preparation of the FIG. 1 transistor using a fabrication technique according to the invention;

FIG. 3 is a schematic plan view of superimposed masks used in fabricating the FIG. 1 transistor; and FIGS. 4(a) and 4(b) shows schematically and in cross-section alternative transistor structures obtainable using the method of the invention.

Referring to FIG. 1, the stacked metal-oxide-semiconductor (SMOS) transistor 10 formed on a silicon substrate has a p-type substrate 12 and p+-type regions 14 underlying SiO$_2$ isolating field oxide regions 16. Within the substrate are n+-type source and drain regions 18 and 20 respectively. Extending between the source and drain regions and overlying the substrate is a first gate oxide layer 22. Over the gate oxide layer is a recrystallized polysilicon gate 24 and a second gate oxide layer 26. Overlaying the whole structure is a recrystallized polysilicon layer 28 which is appropriately doped to give source and drain regions 30 and 32 which respectively contact the source and drain regions 18 and 20 in the silicon substrate. Between the source and drain regions at respective levels are p-type channel regions 34 and 36.

The FIG. 1 device is an n-channel enhancement mode transistor. In operation, a voltage applied to the common gate 26 induces an electric field within regions 34 and 36. When the gate voltage is of proper polarity and magnitude a localized inversion layer is formed both above and below the gate to render the upper and lower channel regions 34 and 36 conducting.

The FIG. 1 transistor has two channel regions 34, 36 but there is no reason why in principle the transistor should not have more than two vertically spaced channels if several vertical layers are desired.

Having specifically described the FIG. 1 structure a preferred method for fabricating it is now described.

Figure 2A:
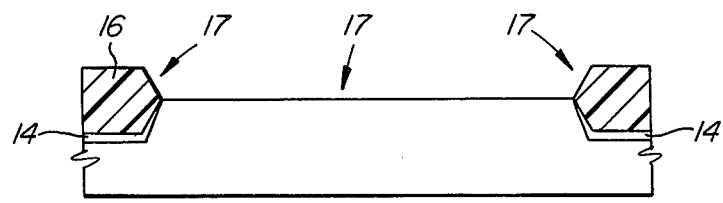
Figure 2B:
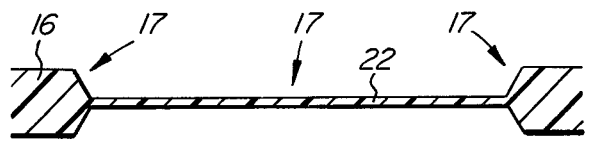

Referring to FIG. 2(a), on a p-type silicon substrate, field oxide 16 is grown using a known LOCOS technique and a mask I (FIG. 3) to define a device well 17. Boron is ion-implanted under the field oxide regions 16 and a first gate oxide layer 22 is thermally grown (FIG. 2(b)).

Figure 2C:
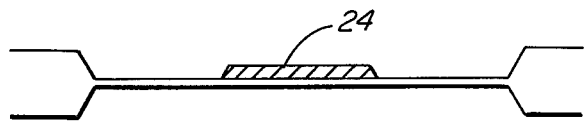

Referring to FIG. 2(c), using a Mask II (FIG. 3) a 7,500° polysilicon layer is low pressure chemically vapour deposited at 625° C. and then patterned to produce a common gate region 24.

Figure 2D:
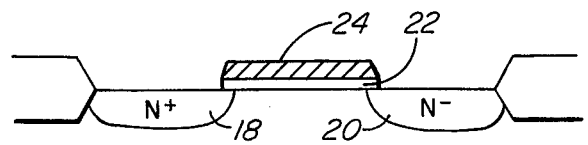

Referring to FIG. 2(d), standard techniques are used to define the gate oxide 22 and at the same time to define the source and drain regions within the substrate and a phosphorus predeposition and drive-in technique is used to obtain n+-type doping in these regions 18, 20. The polysilicon at the gate region is then recrystallized in a laser annealing step using an argon laser with a power output of about 6 watts, beam diameter of 50 microns and a scan rate of 50 centimeters/second. With these conditions the polysilicon is converted into large grains. The laser annealing step can in fact be used to drive the pre-deposited phosphorus impurities into the gate, source and drain regions.

Figure 2E:
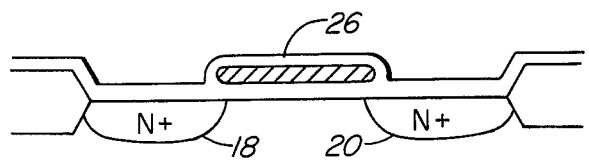
Figure 2F:
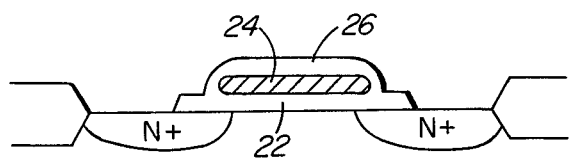

Referring to FIG. 2(e) a 1,000 Å layer of top gate oxide is thermally grown at 1,050° C. in dry oxygen and, using standard techniques the gate oxide 26 is selectively etched to expose the n+-type source and drain regions 18 and 20 (FIG. 2(f)).

Figure 2G:
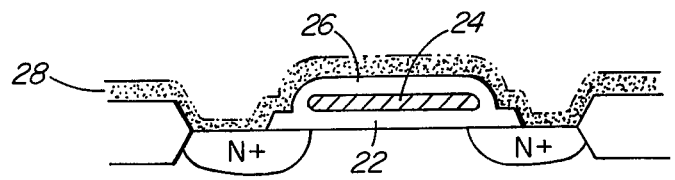
Figure 2H:
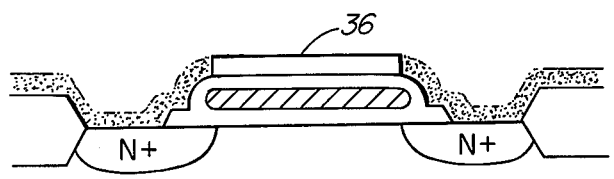

Referring to FIG. 2(g), a 7,500 Å polysilicon layer 28 is low-pressure chemically vapour deposited at 625° C. The layer is then patterned using the Mask III (FIG. 3).

The polysilicon is implanted with boron using a dosage of $5 \times 10^{11}/cm^2$ at 60 kev to form an active p-type top layer substrate for the upper channel 36 of the FIG. 1 transistor. A 600 Å layer of silicon nitride is then low-pressure chemically vapour deposited at 650° C. and is defined so as to cover both the device well which extends between the field oxide regions 16, and interconnect regions 29 which extend from the source and drain to bonding pads. The layer functions as an anti-reflective coating during a subsequent selective laser annealing step using an argon laser with the previously recited operating conditions. The presence of the nitride layer ensures that the underlying polysilicon is melted during laser annealing. The polysilicon overlying the gate 24 since it is thermally insulated from the substrate is hotter than that overlying the source and drain regions and consequently cools and recrystallizes later. The substrate source and drain regions 18, 20 therefore function to seed crystal growth within the polysilicon layer 28, the crystal formation propagating away from the source and drain into the channel reigon 36 overlying the gate 24.

The anti-reflective coating is subsequently removed by etching. Using Mask II (FIG. 3) the phosphorus pre-deposition and drive-in techniques is used to render the regions of the recrystallized polysilicon overlying the substrate source and drain regions n+-type. In effect, additional source and drain regions 30, 32 are formed in the polysilicon 28, these being integral with the source and drain regions 18, 20 in the substrate.

As is evident from FIG. 3 the top polysilicon layer 28 is patterned to provide lead regions 29. The regions are subjected to annealing, dopant pre-deposition and drive-in processes so that they become highly conducting. Subsequently, using Mask IV, contact windows 33 are opened to the regions 29 and aluminum pads 35 are chemically vapour deposited to contact polysilicon areas 31. The device is processed to completion using well known integrated circuit fabrication techniques.

Finally, referring to FIG. 4 there are shown schematically sectional views of transistors produced using the method previously described. FIG. 4(a) shows the transistor described in detail with respect to FIGS. 1 to 3, the transistor having a channel vertically divided into two channel regions. In FIG. 4(b), there is shown a single transistor produced using an iteration of the method, the transistor having a channel vertically divided into four channel regions 34, 36.

What is claimed is:

1. A transistor having first and second semiconductor layers separated by an insulated gate, the layers contacting one another at a first region laterally adjacent the insulated gate, at which first region both of the semiconductor layers are doped to form a source region, the layers contacting one another at a second region laterally adjacent the insulated gate at a position remote from the first region, at which second region both of the semiconductor layers are doped to form a drain region, the transistor having a first channel region extending between the source region and the drain region in the first semiconductor layer below the insulated gate, and a second channel region extending between the source region and the drain region in the second semiconductor layer above the insulated gate.

2. A transistor as claimed in claim 1 in which the first semiconductor layer is substrate silicon and the second semiconductor layer is recrystallized polysilicon.

3. A transistor as claimed in claim 1, in which the gate is insulated from the semiconductor layers by thermally grown silicon dioxide.

4. A transistor as claimed in claim 1, in which the gate is laser recrystallized polysilicon.

5. A transistor as claimed in claim 2, in which the recrystallized polysilicon in the second semiconductor layer at the source and drain regions has a crystal orientation forming an essentially epitaxial continuation of the first semiconductor layer.

* * * * *